US010833264B2

(12) United States Patent
Yakushenko et al.

(10) Patent No.: US 10,833,264 B2
(45) Date of Patent: Nov. 10, 2020

(54) METHOD FOR PRODUCING A MEMORY CELL HAVING A POROUS DIELECTRIC AND USE OF THE MEMORY CELL

(71) Applicant: Forschungszentrum Juelich GmbH, Juelich (DE)

(72) Inventors: Alexey Yakushenko, Aachen (DE); Riccardo Funari, Naples (IT); Kay Johannes Krause, Hueckelhoven (DE); Jan Hendrik Schnitker, Krefeld (DE); Dirk Mayer, Frechen (DE); Nouran Yehia Adly Hassan, Munich (DE); Andreas Offenhaeusser, Aachen (DE)

(73) Assignee: FORSCHUNGSZENTRUM JUELICH GMBH, Juelich (DE)

( * ) Notice: Subject to any disclaimer, the term of this patent is extended or adjusted under 35 U.S.C. 154(b) by 0 days.

(21) Appl. No.: 16/078,655

(22) PCT Filed: Mar. 8, 2017

(86) PCT No.: PCT/DE2017/000063
§ 371 (c)(1),
(2) Date: Aug. 22, 2018

(87) PCT Pub. No.: WO2017/162222
PCT Pub. Date: Sep. 28, 2017

(65) Prior Publication Data
US 2019/0058116 A1 Feb. 21, 2019

(30) Foreign Application Priority Data

Mar. 23, 2016 (DE) .................. 10 2016 003 461
Apr. 1, 2016 (DE) .................. 10 2016 003 770

(51) Int. Cl.
*H01L 45/00* (2006.01)
*G11C 13/00* (2006.01)
(Continued)

(52) U.S. Cl.
CPC ........ *H01L 45/1253* (2013.01); *G11C 13/004* (2013.01); *G11C 13/0009* (2013.01);
(Continued)

(58) Field of Classification Search
CPC ............. H01L 45/1253; H01L 45/1608; H01L 51/0004; H01L 51/0591; H01L 51/107;
(Continued)

(56) References Cited

U.S. PATENT DOCUMENTS 7,307,338 B1 * 12/2007 Mandell .................. H01L 25/16
257/40
8,071,972 B2 * 12/2011 Lu .......................... B82Y 10/00
257/5
(Continued)

FOREIGN PATENT DOCUMENTS

WO    WO 2014061018 A2    4/2014

OTHER PUBLICATIONS

A. M. Buckley, et al., "The Sol-Gel Preparation of Silica Gels", J. Chem. Educ., vol. 7, No. 7, Jul. 1994, pp. 599-602.
(Continued)

*Primary Examiner* — Khiem D Nguyen
(74) *Attorney, Agent, or Firm* — Leydig, Voit & Mayer, Ltd.

(57) ABSTRACT

A method for producing a memory cell includes providing a non-conductive substrate, mounting a first conductor track made of conductive material on the non-conductive substrate, mounting a porous dielectric with or without redox-active molecules in a form of points on the first conductor track, and mounting a second conductor track orthogonally to the first conductor track, wherein the first and second conductor tracks have an electrode function at their intersection point, and wherein the porous dielectric is arranged between the electrodes. The method further includes mount-
(Continued)

a) ROM (BINARY)

b) WORM/RW (BINARY)

c) Multi_Level ROM/WORM/RW (HEX)

ing a passivation layer on the substrate, the first conductor track, the dielectric, and the second conductor track, so that the conductor track remains contactable. The first and the second conductor track form a memory at their intersection point with the dielectric arranged between them, in which the redox reaction of the redox-active molecules is configured to be driven by a voltage.

20 Claims, 8 Drawing Sheets

(51) Int. Cl.
| | |
|---|---|
| *H01L 51/05* | (2006.01) |
| *H01L 51/00* | (2006.01) |
| *H01L 51/10* | (2006.01) |
| *H01L 27/24* | (2006.01) |
| *G11C 11/56* | (2006.01) |
| *G11C 13/02* | (2006.01) |

(52) U.S. Cl.
CPC ...... *H01L 27/2463* (2013.01); *H01L 45/1608* (2013.01); *H01L 51/0004* (2013.01); *H01L 51/0591* (2013.01); *H01L 51/107* (2013.01); *G11C 11/56* (2013.01); *G11C 13/02* (2013.01); *G11C 2213/77* (2013.01)

(58) Field of Classification Search
CPC ............... H01L 27/285; H01L 27/2463; H01L 21/02203; H01L 21/02343; H01L 21/76826; G11C 13/004; G11C 2213/77; G11C 13/0009
See application file for complete search history.

(56) References Cited

U.S. PATENT DOCUMENTS

| | | | | |
|---|---|---|---|---|
| 8,134,139 | B2* | 3/2012 | Lin ..................... | H01L 45/085 257/2 |
| 2005/0274986 | A1* | 12/2005 | Sirringhaus ............ | B82Y 30/00 257/213 |
| 2008/0090337 | A1* | 4/2008 | Williams ........... | G11C 13/0009 438/133 |
| 2008/0152792 | A1* | 6/2008 | Lian ..................... | H01L 51/0004 427/126.1 |
| 2011/0110141 | A1* | 5/2011 | Tran ....................... | H01L 45/16 365/148 |
| 2011/0233508 | A1* | 9/2011 | Araki .................... | B82Y 10/00 257/4 |
| 2013/0260508 | A1* | 10/2013 | Kumar ................ | H01L 45/1633 438/104 |
| 2014/0061757 | A1* | 3/2014 | Kim .................. | H01L 29/42332 257/316 |
| 2014/0273300 | A1* | 9/2014 | Pramanik .............. | H01L 45/144 438/14 |
| 2018/0261400 | A1* | 9/2018 | Fischel ................. | H01G 11/24 |

OTHER PUBLICATIONS

Ilia Valov, et al., "Electrochemical metallization memories-fundamentals, applications, prospects", Nanotechnology, vol. 22, Dec. 2011, pp. 1-22.

* cited by examiner a)

a) ROM (BINARY)

b) WORM/RW (BINARY)

c) Multi_Level ROM/WORM/RW (HEX)

Table 1. Binary system

| Scheme | n | contact sites (2n) | memory cells (2^n) | max. number (Σ(0 to n-1) 1 * 2^n) |
|---|---|---|---|---|
|  | 1 | 2 | 1 | 1 |
|  | 2 | 4 | 4 | 15 |
|  | 3 | 6 | 9 | 511 |
|  | 4 | 8 | 16 | 65535 |
|  | 5 | 10 | 25 | 33554431 | etc.

Table 2. Hexadecimal system

| Scheme | n | contact sites (2n) | memory cells (2^n) | max. number (Σ(0 to n-1) 15 * 16^n) |
|---|---|---|---|---|
|  | 1 | 2 | 1 | 15 |
|  | 2 | 4 | 4 | 65535 |
|  | 3 | 6 | 9 | 68719476735 |
|  | 4 | 8 | 16 | 18446744073709551615 |
|  | 5 | 10 | 25 | 1267650600228229401496703205375 (1.26 * 10^(30)) | etc.

METHOD FOR PRODUCING A MEMORY CELL HAVING A POROUS DIELECTRIC AND USE OF THE MEMORY CELL

CROSS REFERENCE TO RELATED APPLICATIONS

This application is a U.S. National Stage Application under 35 U.S.C. § 371 of International Application No. PCT/DE2017/000063 filed on Mar. 8, 2017, and claims benefit to German Patent Application Nos. DE 10 2016 003 461.0 filed on Mar. 23, 2016, and DE 10 2016 003 770.9 filed on Apr. 1, 2016. The International Application was published in German on Sep. 28, 2017, as WO 2017/162222 A1 under PCT Article 21(2).

FIELD

The invention relates to a method for producing a memory, to a memory, and to the use of the memory.

BACKGROUND

Non-volatile storage techniques are known in the prior art and are used in large volume in data processing and electronic devices or for labeling goods.

There is a 1-bit ROM/WORM memory very widely used in commerce, which is established in the form of an LC oscillatory circuit. The oscillatory circuit has an eigenfrequency established by the component parameters. A test wave can determine a yes/no item of information by the energy absorption of the oscillatory circuit. Such tags are very economical and can be easily switched off or disrupted by applying a strong magnetic field (1-bit ROM/WORM memory).

On the other hand, the storage techniques for more complex information processing and electronic devices are based to a very high degree on the use of silicon technology (CMOS) to produce these memories. Non-volatile memories currently in use utilize solid state physical properties to be able to store an item of information and also to be able to retain it over lengthy periods of time (>10 years) with no external power supply.

EPROMs/EEPROMs/Flash EPROMs: A class of memory components based on silicon semiconductor technology. The basic element of EPROMs/EEPROMs and flash EPROMs is a MOSFET (field effect transistor) having a gate electrode insulated on all sides. The insulation is realized by a layer of $SiO_2$. A charge applied to the gate electrode is retained permanently by the insulating $SiO_2$, which acts as a dielectric and optionally locks the transistor.

EPROM: This type of memory is electrically readable and writable. Before an electrical rewriting can occur, the memory chip must be irradiated with UV. This basic type is realized via the FAMOS (floating gate avalanche injection MOS) cell, in which a p-channel MOSFET is used, or via an n-channel MOSFET, which has a control gate in addition to a floating gate. The writing is done by hot carrier injection (HCI), which exploits the fact that electrons with sufficient kinetic energy can break through a potential barrier and become stored at the gate.

The memory cell must be irradiated with UV for a rewriting. Photons with sufficient kinetic energy, depending on the gate material, excite the electrons of the floating gate, so that they can leave the gate. The erase time is in the order of 10 minutes and requires the mechanical displacement of a glare protection of the memory cell having a quartz glass window, which must be covered in the normal operating/reading mode.

The writing energy amounts to around 1 µJ/bit. The write time is around 3-50 ms, +10 minutes for rewriting. The operating voltage is 3-6 V and the write voltage is around 12 V.

EEPROM (also $E^2PROM$): The electrically erasable PROM (EEPROM) is a memory cell which can be both electrically read and electrically written. The charge applied to the gate is achieved by the quantum physics tunnel effect. The write/erase mode therefore occurs by field emission (Fowler-Nordheim tunneling) when a high electrical field is imposed and it occurs bitwise.

Typical storage capacities are 1-4 Mbit. The write energy is around 1 µJ/bit. The write time is around 1-10 ms and the operating voltage is 3-6 V. The market leader for RFID EEPROM is Atmel, USA. Distribution is through the commercial product ATA5575M1 16 Byte EEPROM Microcontroller, for example.

Flash EPROM (also "Flash Memory"): The layout of this memory cell is based on EPROM technology. In this type of memory, the charge is placed on the gate by the hot carrier injection process and the write/erase process occurs by Fowler-Nordheim tunneling (as with EEPROM). Large numbers of memory cells are arranged in a matrix and are widely marketed in two architectural forms, NAND flash and NOR flash. Thanks to the matrix architecture and use of common branches for source/drain, a complete switching of individual bits is not possible. In particular, the erasing of a state can only be done by blocks.

The typical storage capacities are 1 Mbit to 128 Gbit. The write energy is around 1 µJ/bit, the write time is around 0.1-1 ms. The operating voltage is 3-6 V, 12 V.

MLC NAND (multi-level-cell flash) memory: This memory type is similar to the flash memory, which can only store 1 bit per cell, and can store several bits per cell. The higher storage density is achieved in that several charge states can be distinguished for each transistor. The MLC memories today reach up to 4 bits, and 16 charge states can be distinguished. Typical structure sizes for a transistor with this memory type are 10-20 nm. The market leaders in this segment are SanDisk and Samsung.

Ferroelectric RAM (FRAM or FeRAM): FRAM is likewise based on silicon semiconductor technology. A ferroelectric crystal is placed on the gate of a field effect transistor and this can be polarized by applying a field and the transistor is thus switched. The write energy amounts to around 0.1 µJ/bit. The write time is around 1-10 µs. The operating voltage is 1-3 V. The market leader for RFID FRAM is Fujitsu, Japan.

EEPROM and FRAM memories are used in particular for wireless readable memories, which have become established as RW RFID/NFC tags and have more than >1 bit memory (market leader NXP).

There are few commercial products thus far for printed RFID/NFC tags. The best known approach is that of Thin Film Electronics ASA. Here, a printed non-volatile memory based on ferroelectric polymers is used. In these memory cells, the ferroelectric polymer is embedded in a passive matrix between two electrodes. At each intersection of the conductive metallic contact lines there is formed a ferroelectric capacitor, which defines a memory cell.

Electrochemical memories are known, such as an electrochemical metallization memory (ECM) or memristor devices in general. These are mostly based on an electrochemical method, such as is known from Valov et al. (Ilia Valov, Rainer Waser, John R. Jameson and Michael N. Kozicki, 2011. Electrochemical metallization memories: fundamentals, applications, prospects. Nanotechnology 22, 254003 (22 pp.) doi: 10.1088/0957-4484/22/25/254003).

The working principle of the ECM is that of an electrochemical memristor. A memristor is a passive electronic component whose electrical resistance is not constant, but instead depends on its past. The current resistance of this component depends on how many charges have moved in what direction in the past. Hence, the resistance value can be adjusted through the time function of the current. Even without energy input, this resistance is permanently maintained. Between the electrodes of a memory cell there is an electrolyte of metal salts or metal oxides, often being liquid but for the most part being solid. If a reducing potential is applied between the electrodes, metal cations are reduced to elemental metal and form fibers, known as filaments, from the working electrode to the counter electrode, which produce a conductive connection between the electrodes. When the reverse, oxidizing potential is applied, the metals are oxidized and these fibers dissolve again. When both electrodes are bridged by a conductive fiber, the current can flow with little resistance and the memory cell shows the state "1". When the electrodes in the cell are not connected by fibers, the resistance is large and the memory cell is at "0".

SUMMARY

In an embodiment, the present invention provides a method for producing a memory cell. The method includes providing a non-conductive substrate, mounting a first conductor track made of conductive material on the non-conductive substrate, mounting a porous dielectric with or without redox-active molecules in a form of points on the first conductor track, and mounting a second conductor track orthogonally to the first conductor track, wherein the first and second conductor tracks have an electrode function at their intersection point, and wherein the porous dielectric is arranged between the electrodes. The method further includes mounting a passivation layer on the substrate, the first conductor track, the dielectric, and the second conductor track, so that the conductor track remains contactable. The first and the second conductor track form a memory at their intersection point with the dielectric arranged between them, in which the redox reaction of the redox-active molecules is configured to be driven by a voltage applied via the conductor tracks to the electrodes in order to generate a storage state.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
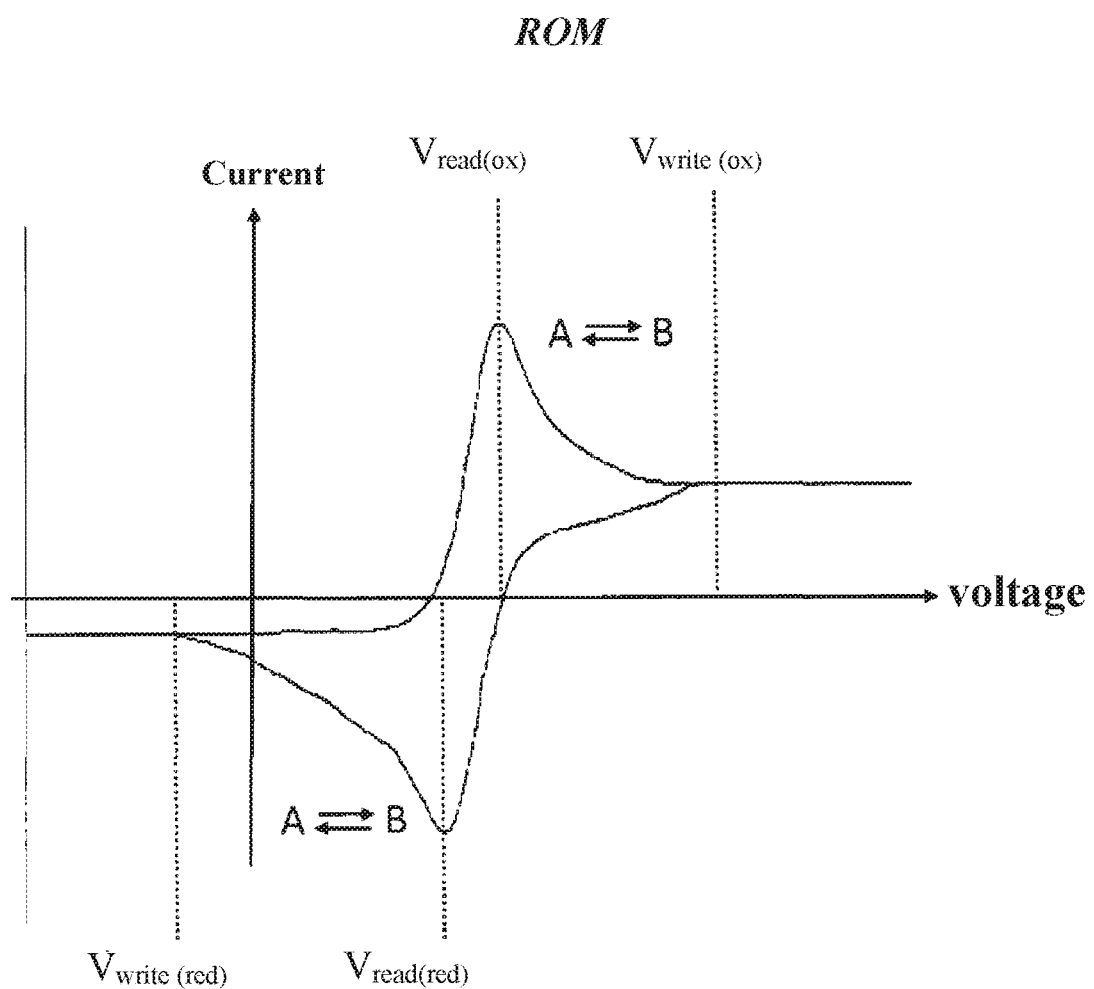
FIGS. 1 a through 1 c show, for ROM, WORM, and RW, a curve of a measured redox cycling current as a function of the applied voltage, represented by cyclical voltammograms of the redox-active molecules used.
Figure 1:
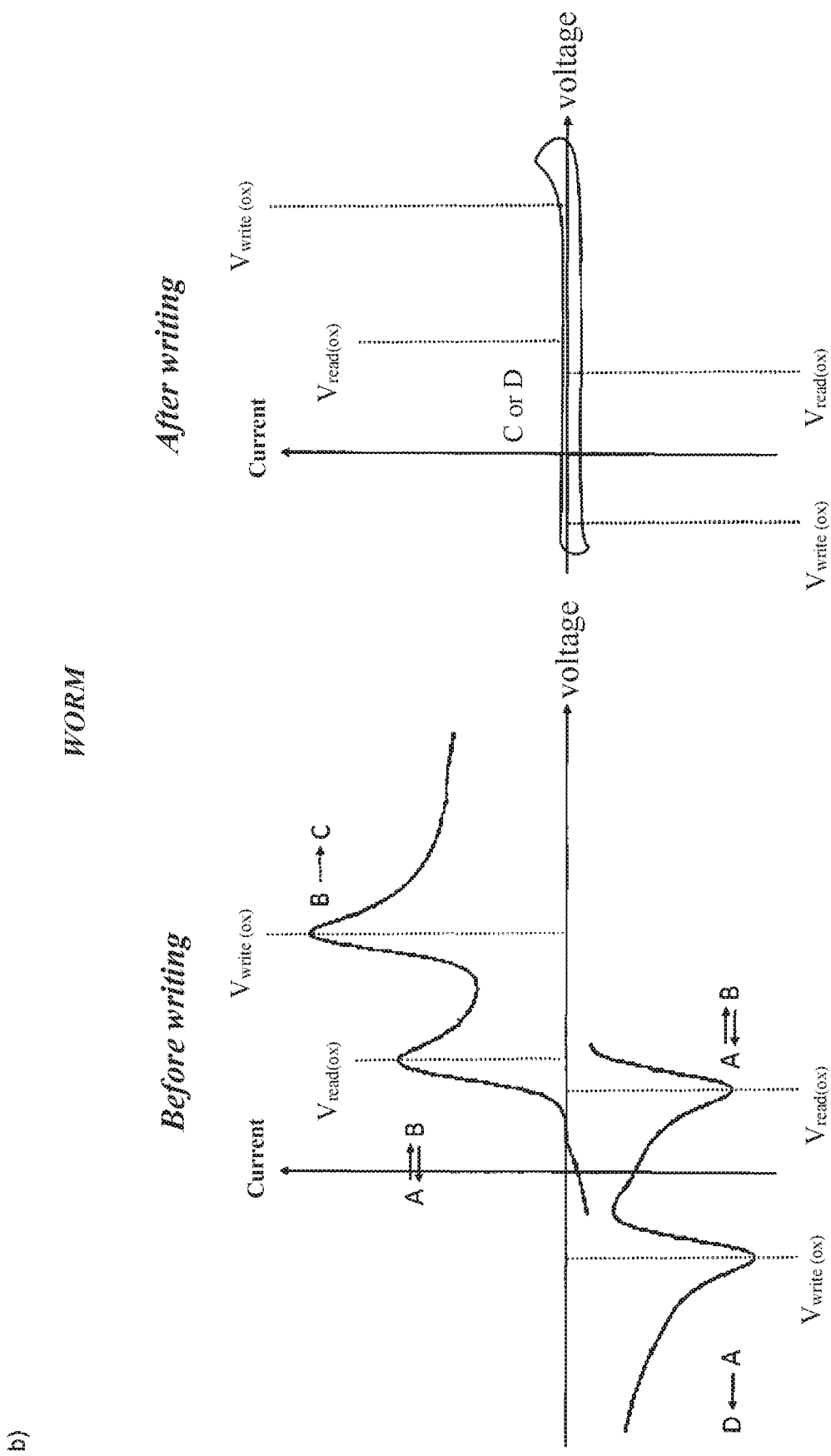
Figure 1:
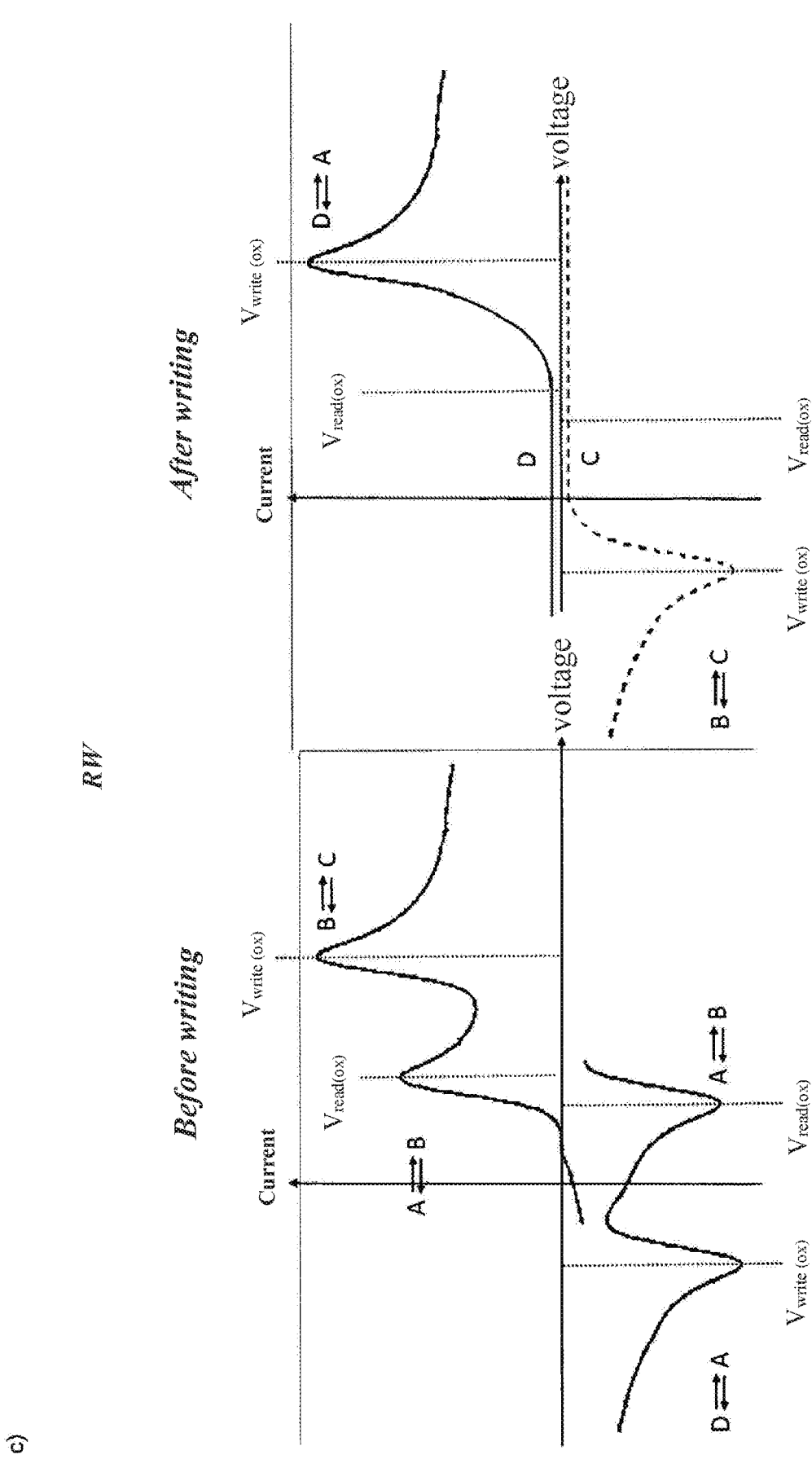

The prior art has a number of drawbacks. The drawback of LC oscillatory circuits is the limitation of the storage capacity to 1 bit. EEPROM and FRAM are both costly to produce on account of the silicon semiconductor technology required (e.g. around 0.5 to 1.0€ per RFID tag). Moreover, the energy needed for the switching is very high, especially for EEPROM. Since when used as RFID only around 1/1000 of the energy used for the reading can be taken up by the tag antenna, the range and performance are limited by the energy demand of the memory cell.

On the other hand, FRAM is more energy-saving, but due to the more complex fabrication and the ferroelectric crystal structure required it is even more costly than EEPROM. These methods are only profitable, if at all, when a very high integration density and large absolute storage amounts can be produced. Storage amounts in the range of a few bits up to the Megabit range are economical, but cannot be realized with this technology, since the basic costs for this technology are already very high.

Electrochemical metallization memories are produced by photolithography methods for the microstructuring and nanostructuring. These methods are likewise complex per se and therefore costly.

The methods published thus far for the production of non-volatile memories are complex and thus time and/or cost intensive.

Embodiments of the invention provide a new kind of memory being improved relative to the prior art. Embodiments of the invention further provide a method for the production of the memory and to indicate uses for it.

A method according to an embodiment of the invention for producing an electrochemical memory is characterized by the following steps:

a) providing a non-conductive substrate;
b) mounting a first conductor track made of conductive material on the substrate;
c) mounting a porous dielectric with a definite concentration of redox-active molecules in the form of points on the first conductor track, wherein in some cases the concentration of the redox-active molecules should be zero;
d) mounting a second conductor track orthogonally to the first conductor track or with an angle of 5-90 degrees, wherein the conductor tracks have an electrode function at the intersection point, between which the dielectric is arranged; this allows the voltage-driven redox reaction of the redox-active molecules at the electrodes;
e) mounting a passivation layer on the substrate, the first conductor track, the dielectric and the second conductor track.

Additional passivation layers may be arranged for the passivation of the conductor tracks. For example, with the exception of the dielectric, the structure at the end of step c) can be optionally passivated by arrangement of a passivation layer.

Unlike the case of redox-active sensors, there are thus no access points to the electrodes, except for the contact sites at the end of the conductor tracks, and instead this is a fully self-enclosed system with no leakage currents and/or evaporation of the redox-active molecules.

The first and the second conductor track form a non-volatile 1-bit memory at their intersection point with the dielectric arranged between them, in which the redox reaction of the redox-active molecules is driven by applying voltage via the conductor tracks to the electrodes.

The electrically non-conductive substrate used may be glass, silicon dioxide or polymers etc.

The material for the first conductor track or electrode may be, for example, gold, platinum, carbon, conductive polymers, etc.

A plurality of conductor tracks may be arranged preferably orthogonally to each other. A "crossbar" structure is then advantageously provided.

The first conductor track(s) are applied preferably by means of an inkjet printing method or other printing method in a finished structuring. This advantageously reduces the costs during production of the memory.

A printing method, especially digital printing methods such as inkjet printing or aerosol-jet printing, is advantageously fast, economical, and very easy to reproduce. Furthermore, the digital method allows an arrangement of different inks, such as inks with different concentrations of redox molecules, in the form of points at the intersections, which is especially advantageous for the memory.

The method for the production of the redox cycling memory thus involves in particular, but not exclusively, a choice of conductive and/or insulating particles, in particular printable ones, by which the conductor tracks or electrodes and/or the dielectric can be structured and arranged on top of one another. In particular, but not exclusively, inkjet printing, aerosol-jet printing, screen printing, gravure printing, offset printing, microcontact printing, nanoimprint printing or hot embossing are used. Combinations of coating and removal steps can be performed, which apply the same layers in combination with different coating methods such as slot die, laser erosion, etc. In particular, inkjet printing is used exclusively, since it is an especially economical method.

The first conductor track has either no pores or only very small pores as compared to the overlying dielectric. Accordingly, the conductor track must be conductive, chemically inert, and have low charge transfer resistance and thus good electrochemical properties. This advantageously ensures that cyclical voltammograms can be measured trouble-free with standard redox molecules.

In the case of inkjet printing, the ink should preferably be sintered after printing on the substrate. For this, thermal, photonic, UV or other sintering methods can be performed to produce a homogeneous conductive layer for the first conductor track.

After this, a dielectric ink is printed at the future intersection point. A sol-gel or hydrogel is preferably used as the ink and optionally the ink already contains redox molecules as the active material and later forms the nanoporous dielectric.

The ink may additionally contain other additives, such as soft polymers for enhanced elasticity as well as substances which improve the printing qualities of the inks.

Before the next conductive upper conductor track or electrode is printed, the ink should cure but not dry out. In the case of sol-gel based ink, this means that the condensation reaction of the sol-gel should take place. The pores formed by the sol-gel reaction can be smaller than the particles for the conductive ink of the upper conductor track or electrode.

After this, the second conductor track preferably consisting of a conductive ink is printed orthogonally to the lower conductor track, so that the conductor tracks can perform an electrode function at the intersection point of the upper conductor track and the lower conductor track. Preferably, a plurality of second conductor tracks is arranged orthogonally to the first conductor tracks in "crossbar" structures.

The nanoporous dielectric layer is enclosed in a "sandwich" structure between the lower first conductor tracks and the upper second conductor tracks at the respective intersection points, thereby forming the storage matrix.

In the case of inkjet printing, the ink for the second conductor track(s) should comprise nanoparticles preferably made of gold, platinum, carbon, conductive polymers, etc. The nanoparticle size for the ink of the second conductor track should not be smaller than the pores in the underlying dielectric layer, so that the nanoparticles for the formation of the second conductor track cannot penetrate into the interlayer, or dielectric, and cause a short circuit between the electrodes. This ink as well should preferably be sintered, for example by thermal, photonic, UV or other methods, thereby forming a conductive track.

Optionally, the high resolution of the printing process in the z-axis is utilized to generate electrochemical nanostructures.

Preferably, a method for producing a printed redox cycling cell, for example, is applied to a "crossbar" architecture and expanded so that not only 1×1 conductor track and cell, but also for example 2×2 or 4×4 conductor tracks and a corresponding number of redox cycling cells are arranged alongside each other.

In these configurations, the surface regions of the first conductor tracks at the intersection points serve as lower electrodes for several redox cycling cells at the same time. Moreover, the surface regions of the second conductor tracks at the intersection points serve as upper electrodes for the necessary redox cycling process.

The formation of individual redox cycling cells or memory cells by means of printing methods, such as an inkjet printing method, can therefore involve at least the following steps:

a) providing a first electrically conductive electrode on the substrate;
b) arranging a porous dielectric layer on the first electrode, in which the pores lead right down to the surface of the first electrode;
c) arranging a second electrically conductive electrode on the dielectric layer; wherein at least one of steps a) to c) is carried out with a printing method of electrically conductive and/or electrically insulating particles;
d) passivating the layer structure.

Of course, the electrodes are contactable, being contacted via the free ends of the conductor tracks which are contactable in this way.

Thus, a porous dielectric layer is arranged at an intersection point at least at the first electrode in the form of points, where the pores of the dielectric lead right down to the surface of the first electrode. The pores in the dielectric layer are filled with redox-active molecules. Preferably, the redox-active molecules are already contained in the ink.

The nanoscaled redox cycling memory is produced preferably only by means of printing technologies and without additional etching steps or sacrificial layers. In this design, the electrodes arranged one above the other in the z-axis and separated by a nanoscaled dielectric are preferably entirely printed.

Advantageously, there are no etching steps in this method. This is accomplished in that the three layers, 1) first lower conductor track, 2) nanoporous dielectric layer, and 3) second upper conductor track, preferably have different porosity.

The ink of each further layer should have a larger particle size than the previous, lower layer, so that the layers during the printing in the liquid phase, for example by means of inkjet printing, cannot flow into the layer underneath. In this way, it is possible to reliably separate the different layers electrically and prevent short circuits by bridging from conductive material flowing through the dielectric separation layer.

Advantageously, the ink for the porous dielectric layer is prepared so that it cures after its deposition on the first conductor track, for example by means of inkjet printing, and has the desired porosity, yet at the same time still contains enough liquid to ensure transport of the redox molecules to the electrodes.

This effect can be accomplished by the use of sol-gel materials and a sol-gel ink with a solvent having low vapor pressure or low evaporation rate or high boiling point.

Preferably, the ink for this comprises, for example, tetramethyl orthosilicate (TMOS), tetraethyl orthosilicate (TEOS), tetraisopropyl orthosilicate (TPOS) as the silicate for the sol-gel. The ink can also be made with other materials, such as aluminum (2-propylate), aluminum (2-butylate), zirconium propylate, titanium ethylate, titanium (2-propylate) or the like. In general, an alkoxide of an element chosen from the group of silicon, titanium, aluminum, zirconium, germanium, tin, lead and antimony should be used for a sol-gel ink for the nanoporous dielectric.

Another aspect for the preparation of this ink relates to the mixing of alkoxide solution with an alcohol, deionized water, and an acid catalyst and/or basic catalyst with the redox-active molecule for the production of the ink for the nanoporous dielectric.

The ink for the nanoporous dielectric may also comprise, for example, a hydrogel as the dielectric nanoporous material, or the ingredients for forming hydrogels.

The solvent used for the liquid remaining after the drying of the nanoporous dielectric may be in particular, but not exclusively, glycerol, various glycols such as ethylene glycol, diethylene glycol, triethylene glycol, propylene glycol, dipropylene glycol, tripropylene glycol, etc., as well as polyglycols with different chain lengths, such as with up to 200, 300, 400 or more monomer units. It is also conceivable to use polyethylene glycol, polypropylene glycol, etc.

In addition, the ink as mentioned may optionally already contain a redox-active material, depending on the type of memory and its arrangement.

The redox-active molecules which may be considered are, for example, hexacyanoferrate, iridium hexachloride, ferrocene and its derivatives such as ferrocene methanol, ferrocene dimethanol, ferrocene carboxylic acid, ferrocene dicarboxylic acid, quinone and its derivatives, such as orthoquinone, dopamine, benzoquinone, etc., as well as other redox-active molecules.

After deposition of the second conductor track as the upper electrode on top of the dielectric, the redox molecules should diffuse freely in the remaining liquid of the dielectric nanoporous layer and arrive at the electrodes for the redox reaction.

The dielectric nanoporous layer fulfills at least two functions:

1.) It decouples the two electrodes, that is, the lower and the upper one, electrically from each other by a very thin dielectric layer, generally less than 1000 nm, especially 100-300 nm thick.

2.) The dielectric in the finished state allows the diffusion of the electrochemically active molecules (redox molecules) at the electrodes, so that a redox cycling process can occur between the lower and the upper electrode.

All materials which fulfill these two requirements can be used for the nanoporous dielectric layer, especially sol-gel materials or hydrogels, but also other materials. The sol-gel formation of a silica gel at the pointlike deposited dielectric occurs in the steps as described in the publication "The Sol-Gel Preparation of Silica Gels" (Buckley, A. M., Greenblatt, M., 1994. Journal of Chemical Education, Volume 71, No. 7, 599-602) and its content is hereby incorporated by reference in this patent application especially for the production of the sol-gel.

In a further step, the storage structure consisting of a plurality of memory cells is coated with a nonporous dielectric, i.e. completely passivated. For this, a lamination method can be carried out, for example. Only the contact sites of the conductor tracks for the electrical contacting and application of voltage remain free.

A passivation layer with a nonporous and/or non-evaporable and/or gas-impervious layer has the advantageous effect that the liquid, if present, in the dielectric nanoporous layer does not evaporate. In addition, the passivation layer as a protection layer ensures a greater mechanical stability of the structures.

It is advantageously possible to also enlarge the cell array in the vertical direction, in order to increase the number of cells per area and thus the storage density. In such a design, a further dielectric is placed on the upper electrode and then a second upper electrode is arranged in the next step.

This configuration can be further expanded in the Z direction, and is limited only by the problems of the contacting of the conductor tracks for storage control. Furthermore, the conductor tracks may also be interconnected in the Z direction.

In a two-level redox cycling architecture, the "first upper electrode" is then used as the lower electrode for the upper cell, while the "second upper electrode" acts as the upper electrode for this cell.

During the redox cycling, the electrochemically active molecules, or redox molecules, may be alternately oxidized and reduced continually in the liquid volumes of the dielectric nanoporous interlayer of the dielectric at the electrodes. Thus, these reactions occur between the electrodes. For this, corresponding oxidizing and reducing potentials are applied to the electrodes, so that the redox molecules are directly oxidized or reduced upon contacting of the electrodes. Because each molecule can be alternately oxidized at the one electrode and then reduced again at the other electrode, each molecule contributes repeatedly to the charge transport between the electrodes, which in turn results in an amplifying of the overall current.

For certain applications (e.g., for WORM—write once read many memory), irreversible oxidation states may also be desirable. In this case, the opposite reaction is not possible. For example, the molecules of the viologen family advantageously possess such properties. They occur mostly in three oxidation states, in which the second oxidation reaction usually occurs irreversibly:

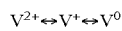

All molecules which follow this reaction can basically be used for WORM memory cells.

The movement of the redox molecules in the liquid medium of the dielectric between the electrodes is driven by the diffusion in the nanoporous dielectric. In a diffusion-driven movement, the transport time is scaled with the square of the distance, and therefore a special arrangement of the electrodes is needed to realize such a memory, in which the electrodes lie very close against each other. The efficiency of the redox cycling or signal amplification depends on the square of the distance between the electrodes.

Ideally, a distance in the nanometer to micrometer range is used for the electrodes, which allows a large current amplification. The absolute redox cycling current in this case scales in a linear manner with the concentration of the redox molecules.

In this way, in particular, a printed electrochemical storage device based on redox cycling is provided, acting as a non-volatile memory. The special properties of this device are:

non-volatile memory;
low production costs (<1 cent) by printing methods (roll to roll);
energy-saving (fJ to nJ per event) read and write processes;
different configurations depending on the redox-active molecule used: read-only memory (ROM), write once read many memory (WORM) and re-writable memory (RW);
typical absolute storage capacities from a few bits to several kBytes;
very large variance in the realization of the storage density is possible, depending on the manufacturing technique and the read method;
possibility of multi-level coding, i.e. memory cells in which not only two states, "0" and "1", can be written, but also more, such as "0", "1", "2" and "3", and so on. These can be achieved by the manufacturing and/or reading method. According to embodiments of the invention, "reading" can mean the activating/deactivating of the molecule in order to make it redox-active/redox-inactive, respectively. For example, this can be achieved by the changing of the oxidation state of the molecule as with viologen ($V^{2+} \leftrightarrow V^+ \leftrightarrow V^0$).

However, structural changes of the molecule can also be achieved, which are caused by the oxidation/reduction, such as in the case of various ferrocene derivatives ($A \leftrightarrow B \leftrightarrow C$). In order to encompass all these possible changes and avoid charge balance problems in the formulas, the molecules are indicated schematically as $A \leftrightarrow B$, $B \leftrightarrow C$, $A \leftrightarrow D$, etc.

Typically achievable storage densities of the sensor (without feed line): 10 to 105 per bit/mm$^2$ depending on the production method. For multi-level memory cells, the storage density is distinctly larger;
compatibility with devices and protocols for RFID/NFC and other wireless communications systems which are used in the Internet of Things (IoT);
compatibility with devices and processes of printed electronics for applications in IoT;
possible use of non-toxic/non-environmentally harmful materials for the memory production (especially for use in food packaging);
redox cycling method without reference electrode, since the storage system is self-enclosed.

The method for production of the memory cell(s) is characterized in particular in that the first conductor track and/or the dielectric and/or the second conductor track can be provided by a printing method, in particular inkjet printing. This is advantageously more economical than silicon fabrication technologies.

The method can be carried out by choosing an ink for the dielectric, which after being applied on the first conductor track is dried and forms a sol-gel or a hydrogel with pores. This constitutes a comparatively simple option of defining the nanoporous dielectric and providing it with a given size of pores, especially after a printing process. For this, a method can be used as described for example in The Sol-Gel Preparation of Silica Gels (Buckley, A. M., Greenblatt, M., 1994. Journal of Chemical Education, Volume 71, No. 7, 599-602). This publication and the method for production of the sol-gels are incorporated by reference in their entirety in the present patent application.

According to embodiments of the invention, an ink can be chosen which already contains the redox-active molecules, besides the ingredients for the formation of the gels, which after the printing or the formation of the nanoporous dielectric diffuse into the pores of the dielectric at the electrodes and react electrochemically at the electrodes. This advantageously represents a significant simplification of the method.

Of course, the method steps according to claim 1 may be repeated. This advantageously has the effect that the steps can be employed to form a plurality of conductor tracks arranged orthogonally to each other in a storage array. This has the advantageous effect of producing a "crossbar" structure.

The "crossbar" architecture of several redox cycling memory cells at the intersection points has the advantageous effect of creating n^2 redox cycling cells and accordingly n^2 bits per 2n contact points. This results in the highest possible two-dimensional packing density.

It is important to understand that electrochemical currents may arise in this kind of memory even without redox cycling reactions. If corresponding read potentials (cathodic read potential$_{red}$ and anodic read potential$_{Ox}$) are applied to two orthogonally situated conductor tracks in order to read the state of the bit, an electrochemical current is generated at all intersection points with redox-active molecules on the conductor tracks. But since only one of the two read potentials (Ox or Red) is placed on all bits, except for the intersection point of the conductor tracks, only a partial reaction is possible in the other bits, i.e. A→B, or B→A. Thus, the current is not amplified and hence it has a significantly lower value than for the bit at the intersection point of the two addressed conductor tracks, where the forward and the reverse reaction are possible.

The threshold value passed for which a measured current is evaluated by redox cycling amplification of the reaction A↔B and thus as state 1 is, according to embodiments of the invention, preferably at least three times higher than the non-amplified noise (current noise). This definition holds for all mentioned memory cells ROM/WORM/RW.

Thanks to these greater current strength differences at the intersection point than all other memory cells of the array, a high signal to noise ratio results. This signal to noise ratio makes possible the redox cycling-based electrochemical memory. The state of a bit as "1" is then related to a certain minimum current which must be achieved when the read potentials are applied. This minimum current must naturally be defined larger than the background current through the half-reaction at the non-addressed bits of the particular conductor tracks.

Moreover, thanks to the choice of ink with different concentrations and/or substances of redox-active molecules for the storage array with the method, the following advantages can be utilized in the method:

Thus, it is possible to realize a memory cell with multi-level coding, in which besides two binary states "0" (no redox molecules) and "1" (redox molecules present) other states are also present. This is realized, for example, by depositing inks with different concentrations of redox molecules in the memory cells.

Example

In the reading method, 16 different concentrations of the redox-active molecule ferrocene dimethanol are distinguished, for example 0 µM, 1 µM, 5 µM, 10 µM, 25 µM, 50 µM, 100 µM, 200 µM, 300 µM, 400 µM, 500 µM, 600 µM, 700 µM, 800 µM, 900 µM, 1000 µ&M. In this way, 16 different states can be advantageously written into each individual memory cell. It is then possible to use for the memory instead of a binary basis a hexadecimal system, for example, and to write units of the hexadecimal system, 16 base (HEX): 0, 1, 2, 3, 4, 5, 6, 7, 8, 9, A, B, C, D, E, F, or in short from 0 to F.

This advantageously increases the storage density, i.e. the possible kind of storage states per physical area. Hence, these memory cells with multi-level coding afford much higher capacities, even though the number of storage nodes remains the same. For example, eight bits are normally assembled into a byte. For binary bits ("0" or "1"), one byte corresponds at most to the number Sum (n=0 to 7) $2^n=2^0+2^1+2^2+2^3+2^4+2^5+2^6+2^7=255$. This means that with one binary byte it is possible to store numbers from 0 to 255.

By comparison, according to embodiments of the invention, thanks to the use of hexadecimal bytes ("A" to "9") the maximum representable number corresponds to the number Sum (n=0 to 7) $16^n=16^0+16^1+16^2+16^3+16^4+16^5+16^6+16^7=286,331,153$, i.e. numbers from 0 to 286,331,153 can be stored. This results in a significantly higher storage density than in traditional storage systems. The differences between the binary and the hexadecimal memory cell systems can be found in Table 1 (binary) and Table 2 (HEX).

Both storage systems and other systems are realized according to embodiments of the invention.

An electrochemical memory or such a memory cell according to embodiments of the invention comprises at least one arrangement of a first electrically contactable conductor track on a non-conducting substrate, a second electrically contactable conductor track arranged orthogonally to this, wherein the conductor tracks have an electrode function at the intersection point and wherein a porous dielectric with redox-active molecules freely diffusible into the pores is arranged between the two conductor tracks at the intersection point. These redox-active molecules are oxidized and reduced at the electrodes of the conductor tracks by imposing electrical voltage (read potentials Ox and Red) to create a defined state or to read out the state, wherein the memory formed from substrate, conductor tracks and dielectric is completely passivated by a passivation layer. There are no separate feed lines or drain lines for redox-active molecules, so that this is a non-volatile memory, more precisely, a single memory cell of such a memory. Write processes for WORM and RW memory cells area likewise possible, as shall be shown.

A storage array according to embodiments of the invention comprises a plurality of such passivated electrochemical memory (cells) in a "crossbar" configuration, produced with the above described method.

Preferably, in one embodiment of the invention, a storage array is characterized by a plurality of memory cells. A storage array according to an embodiment of the invention is characterized in particular in that the memory or the individual memory cells have dielectrics with respectively different concentrations of redox-active molecules and/or different and/or no redox-active molecules. In this way, memory cells with a multi-level coding are advantageously developed from the proposed device.

The configuration with several kinds of redox materials can furthermore be combined especially advantageously with the configuration of several concentrations of redox-active molecules to produce further, even more complex memory cells, with multi-level coding.

This advantageously has the result of providing a non-volatile memory by a printed device based on redox cycling and "crossbar" architecture. For this, the memory is produced with dielectric nanoporous ink comprising redox molecules.

The storage array may have at least one storage state without a redox-active molecule to form the state 0 and at least one storage state with a redox-active molecule, wherein by imposing voltage (read potential Ox and Red) across the conductor tracks on the electrodes, the redox-active molecule reversibly forms only one oxidized and one reduced form to create the state 1.

In Tables 3 to 5 below, the question mark symbol (?) represents an unknown memory cell value. GND=ground; read potential=potential at the cathode and at the anode sufficient only to drive the reversible redox reaction A↔B for reading of the memory cell value or state "1", but not to generate write processes; write potential=potential at the cathode and at the anode sufficient to drive a reversible or irreversible redox reaction for the rewriting of the redox-active molecule A and/or B by oxidation and/or reduction and to generate the memory cell value or state "0" (binary) or an intermediate value (hex or other system). In the case of WORM, a write potential directionally generates a state of progressively smaller concentrations of [A and B] in the memory cell; in the case of RW the concentration of [A and B] is replenishable.

ROM 1.a. ROM: An ROM memory cell is advantageously characterized in that it comprises a nanoporous dielectric either without or with a redox-active molecule. In the ROM with a redox-active molecule, precisely one redox reaction occurs, with which the redox-active molecule switches reversibly between its two oxidation stages, the oxidized and the reduced state.

The following modes for writing and reading are possible; see Table 3a, 3b and FIG. 1a with corresponding cyclical voltammogram.

TABLE 3a

| ROM - binary system | | |
|---|---|---|
| Value (binary) | 0 | 1 |
| Current value (discrete) | 1 | 2 |
| Concentration [A + B] (discrete) | 0 | 1 |

| Mode | Redox molecule concentration (discrete) | Cathode potential | Anode potential | Current value (discrete) | Memory cell value |
|---|---|---|---|---|---|
| Rest | [A + B] = 0 | none | none | none | ? |
| Read | [A + B] = 0 | $V_{read(red)}$ | $V_{read(ox)}$ | 1 | "0" |
| Rest | [A + B] ≠ 0 | none | none | none | ? |
| Read | [A + B] ≠ 0 | $V_{read(red)}$ | $V_{read(ox)}$ | 2 | "1" |
| Write | | | not possible | | |

Thus, for a binary ROM configuration, two different kinds of the dielectric nanoporous layer are arranged at the intersection points: one with redox-active molecules (state "1") and one without redox-active molecules (state "0"). If oxidation and reduction potentials exceeding the normal potential of the redox-active molecule are imposed as read potentials on the lower and the upper electrode via the conductor tracks, a redox cycling will occur in the cells with redox-active molecules, while only background noise occurs in the cell without redox-active molecules. By reading out the current signal of the electrodes, "1" and "0" states of the memory cell may accordingly be identified. The redox-active molecule should accordingly have the lowest possible reversible oxidation and reduction potential, in order to reduce the reading energy. For ROM, only the following reaction occurs:

$$A \leftrightarrow B$$

1.b. Multi-level ROM: like 1.a., but with several concentrations of redox molecules, for example, with 16 different concentrations such as 0 μM, 1 μM, 5 μM, 10 μM, 25 μM, 50 μM, 100 μM, 200 μM, 300 μM, 400 μM, 500 μM, 600 μM, 700 μM, 800 μM, 900 μM, 1000 μM of ferrocene dimethanol, for example, as the redox-active material for creating hexadecimal memory cells in the storage array.

The following modes for the reading out of the ROM storage array are then obtained in accordance with Table 3b.

TABLE 3b

ROM - hexadecimal system (HEX). This part is also valid after the writing processes in the WORM storage array and RW storage array.

| | Value (HEX) | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | A | B | C | D | E | F |
| Current value (discrete) | 1 | 2 | 3 | 4 | 5 | 6 | 7 | 8 | 9 | 10 | 11 | 12 | 13 | 14 | 15 | 16 |
| Concentration [A + B] (discrete) | 0 | 1 | 2 | 3 | 4 | 5 | 6 | 7 | 8 | 9 | 10 | 11 | 12 | 13 | 14 | 15 |

Multi-level ROM (HEX)—by way of example, i.e. not all 16 states are written:

| Mode | Redox molecule concentration (discrete) | Cathode potential | Anode potential | Current value (discrete) | Memory cell value |
|---|---|---|---|---|---|
| Rest | [A + B] = 0 | none | none | none | ? |
| Read | [A + B] = 0 | $V_{read(red)}$ | $V_{read(ox)}$ | 1 | "0" |
| Rest | [A + B] = 3 | none | none | none | ? |
| Read | [A + B] = 3 | $V_{read(red)}$ | $V_{read(ox)}$ | 4 | "3" |
| Rest | [A + B] = 10 | none | none | none | ? |
| Read | [A + B] = 10 | $V_{read(red)}$ | $V_{read(ox)}$ | 11 | "A" |
| Rest | [A + B] = 15 | none | none | none | ? |
| Read | [A + B] = 15 | $V_{read(red)}$ | $V_{read(ox)}$ | 16 | "F" |
| Write | | | not possible | | |

Accordingly, read potentials are applied to the cathode $V_{read(red)}$ and/or to the anode $V_{read(ox)}$, which lie above (oxidation) or below (reduction) the normal potential of the redox-active molecule and thus drive the cyclical redox reaction A↔B in the dielectric.

Figure 4:
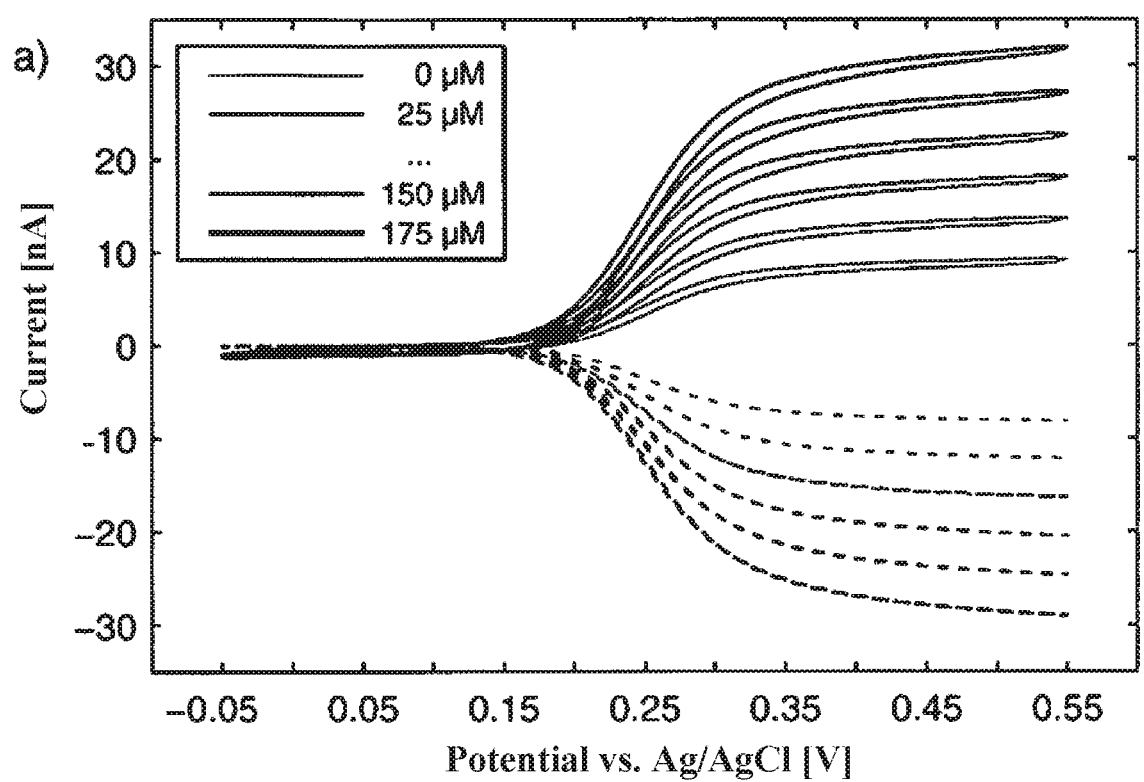
FIG. 4 shows a curve of a measured CV voltammogram as a function of the concentration of the redox-active molecules, using the example of ferrocene dimethanol.
Figure 5:
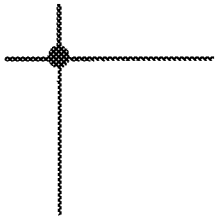
Figure 5:
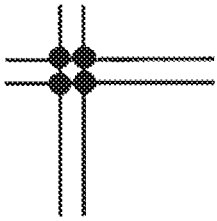
Figure 5:
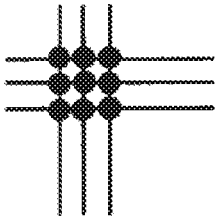
Figure 5:
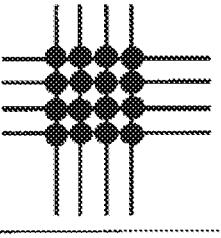
Figure 5:
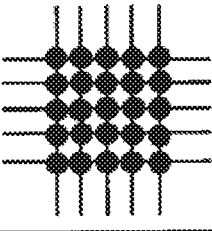
Figure 6:
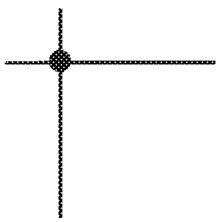
Figure 6:
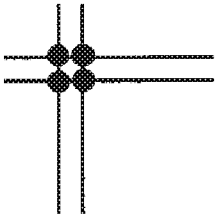
Figure 6:
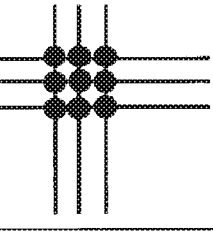
Figure 6:
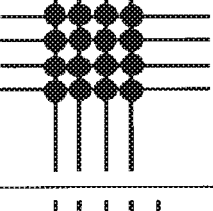
Figure 6:
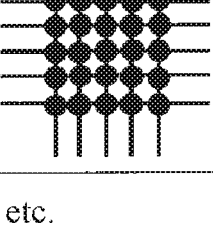

The absolute value of the measured current is a linear function of the concentration of the redox-active molecule and can be associated with different memory cell values (also see FIG. 4).

WORM 2.a. WORM: The WORM memory cell is advantageously characterized in that it comprises a nanoporous dielectric with a redox-active molecule.

For the production of a WORM memory cell, the dielectric is produced with a redox-active molecule of high concentration. The concentration of the redox-active molecule is chosen especially high to enable as many irreversible write processes as possible.

In each WORM memory cell, a reversible redox reaction occurs and at least one irreversible oxidation and/or reduction.

The following modes are possible for writing and reading; see Table 4a, 4b and FIG. 1b with corresponding cyclical voltammogram.

TABLE 4a

WORM (binary): Read 1 - before writing; Read 2 - after writing; Write - applying a write potential; Default - all cells are "1"

| Mode | Redox molecule concentration (discrete) | Cathode potential | Anode potential | Current value (discrete) | Memory cell value |
|---|---|---|---|---|---|
| Rest | $[A + B] \neq 0$ | none | none | none | ? |
| Read 1 | $[A + B] \neq 0$ | $V_{read(red)}$ | $V_{read(ox)}$ | 2 | "1" |
| | Irreversible writing by reduction | | | | |
| Write | $[A + B] \neq 0$ | $V_{write(red)}$ | GND | — | — |
| Read 2 | $[A + B] = 0$ | $V_{read(red)}$ | $V_{read(ox)}$ | 1 | "0" |
| | or irreversible writing by oxidation | | | | |
| Write | $[A + B] \neq 0$ | GND | $V_{write(ox)}$ | — | — |
| Read 2 | $[A + B] = 0$ | $V_{read(red)}$ | $V_{read(ox)}$ | 1 | "0" |

By choosing a suitable redox-active molecule in the ink it is possible to provide WORM memories as well with the method according to the invention. For this, the memory cell has at least two storage states, each with the same molecule, wherein the molecule without voltage applied forms a first state 0 (not redox-active) or 1 (redox-active) and by applying voltage it accordingly forms irreversibly the second state 1 (redox-active) or 0 (not redox-active). The redox-active state "1" indicates the reversible redox reaction which results in the redox cycling current by a device according to an embodiment of the invention.

For the WORM configuration, a dielectric nanoporous layer with a soluble redox-active molecule (state "1") with a correspondingly large diffusion constant is arranged on the first conductor track at all intersection points and is closed with the second upper conductor track in order to form the redox cycling memory cell. This means that immediately after production all these cells have a default value "1".

In order to generate a value "0" from the value "1", a potential should be imposed between the two electrodes of the intersection point, which irreversibly changes the redox molecules so that a redox cycling reaction no longer occurs at this intersection point when a "normal" low read potential is imposed. The redox cycling reaction no longer occurs because the irreversibly altered molecules are no longer redox-active. Also see FIG. 1b with corresponding cyclical voltammograms for WORM memory cells.

These redox molecules must accordingly have a low reversible oxidation and reduction state, and also in addition a higher irreversible oxidation or reduction state.

For example, the molecules from the viologen family have such attributes. These molecules have up to three oxidation states, in which the second oxidation reaction usually occurs irreversibly.

In general, therefore, the following voltage-driven reactions must be able to occur in WORM memory cells:

1) A↔B and
2) B→C and/or
3) A→D where step 1) is reversible and steps 2) and/or 3) are irreversible.

Alternatively, for a WORM configuration a dielectric nanoporous layer with an insoluble redox molecule or a redox-active molecule with a correspondingly small diffusion constant in the default state "0" is arranged at all intersection points.

This means that immediately after production these memory cells have a value "0". In order to generate a value "1" from the value "0", a potential should be imposed between the two electrodes of the intersection point, which irreversibly changes the redox molecules so that they become soluble and obtain a large diffusion constant. A redox cycling reaction in accordance with step 3) then occurs at this intersection point when a "normal" low read potential is imposed.

1) C→B and/or
2) D→A and
3) A↔B

The redox-active molecule must accordingly be irreversibly oxidizable or reducible. In the first oxidation state, the redox-active molecules are not soluble and cannot diffuse between the electrodes. After the irreversible oxidation, the molecules become soluble or mobile and can freely diffuse between the electrodes. They can then be reversibly oxidized and reduced by imposing read potentials (see step 3).

The redox molecules should be chosen appropriately for the nanoporous dielectric layer, because the solubility depends on the medium in which the substance is dissolved. Residual oxidation and reduction currents may also occur in the state "0", resulting from molecules located in the immediate vicinity of the electrodes. These also should then have a reversible oxidation and reduction state in order to be read out (see FIG. 1b).

2.b. Multi-level WORM: The multi-level WORM is prepared as for 2.a. Starting with a high concentration of the redox-active molecule in the dielectric, this is gradually rewritten by different high write potentials to different progressively smaller concentrations of the redox molecule.

Write potentials are basically imposed via the applied time, the size of the write potential or the current in order to produce different concentrations of redox-active molecules. This statement likewise holds for RW memory cells.

The degree of the rewriting is dependent on these parameters. Unlike with binary WORM memory cells in which rewriting can occur once, in multi-level coding a plurality of concentrations of redox-active molecules are possible by write processes. In this way, for example, a total of 16 different concentrations are irreversibly rewritten and read out for generating hexadecimal memory cells.

The following sampling of modes result for reading and storing according to the examples given in Table 4b (also see FIG. 1b and Table 3b, top part, which is likewise applicable for WORM memory cells).

TABLE 4b

Multi-level WORM (HEX), shown by way of example for only two write processes, i.e. not all 16 states are reflected in the table: Read 1 - before writing; Read 2 - after writing; Write 1 - voltage pulse 1 with given parameter; Write 2 - voltage pulse 2 with different parameter; Default - all cells are "1".

| Mode | Redox molecule concentration (discrete) | Cathode potential | Anode potential | Current value (discrete) | Memory cell value |
|---|---|---|---|---|---|
| Rest | $[A + B] = 15$ | none | none | none | ? |
| Read 1 | $[A + B] = 15$ | $V_{read(red)}$ | $V_{read(ox)}$ | 16 | "F" |
| | Write 1 by reduction | | | | |
| Write 1 | $[A + B] = 4$ | $V_{write(red)}$ | GND | — | — |
| Read 2 | $[A + B] = 4$ | $V_{read(red)}$ | $V_{read(ox)}$ | 5 | "4" |

TABLE 4b-continued

Multi-level WORM (HEX), shown by way of example for only two write processes, i.e. not all 16 states are reflected in the table: Read 1 - before writing; Read 2 - after writing; Write 1 - voltage pulse 1 with given parameter; Write 2 - voltage pulse 2 with different parameter; Default - all cells are "1".

| Mode | Redox molecule concentration (discrete) | Cathode potential | Anode potential | Current value (discrete) | Memory cell value |
|---|---|---|---|---|---|
| | | or write 1 by oxidation | | | |
| Write 1 | [A + B] = 4 | GND | $V_{write(ox)}$ | — | — |
| Read 2 | [A + B] = 4 | $V_{read(red)}$ | $V_{read(ox)}$ | 5 | "4" |
| | | Write 2 by reduction | | | |
| Write 2 | [A + B] = 0 | $V_{write(red)}$ | GND | — | — |
| Read 2 | [A + B] = 0 | $V_{read(red)}$ | $V_{read(ox)}$ | 1 | "0" |
| | | or write 2 by oxidation | | | |
| Write 2 | [A + B] = 0 | GND | $V_{write(ox)}$ | — | — |
| Read 2 | [A + B] = 0 | $V_{read(red)}$ | $V_{read(ox)}$ | 1 | "0" |
| Rewrite | | | not possible | | |

Thus, as described, the WORM memory cell is produced with a large concentration of redox-active molecule. A first write process is brought about by imposing the write potential and rewrites the redox-active molecule irreversibly until it has a lower concentration of [A+B], here the discrete concentration 4. The write process occurs either by oxidation or reduction.

All the intermediate levels can be advantageously established by the form of the write pulse. For example, by varying the shape and strength of the voltage pulse only a portion of the redox molecules can be changed irreversibly from the value "1", thereby reaching a certain concentration. One peculiarity in this case is that the memory cell can be written again and again with the proper pulse in the direction of a lower concentration of the redox molecules (less "1", more "0"), but not in the other direction.

Alternatively, the first state is default "0" in the case where insoluble molecules are used at the start. This means that by further voltage pulses more and more insoluble molecules can be oxidized and the concentration can be increased of soluble redox-active molecules, which generate more "1" and fewer "0" states by the reaction A↔B.

RW

It is possible to provide an RW storage array, i.e. rewritable memory cells, with a method according to an embodiment of the invention.

An RW memory cell is advantageously characterized in that it comprises a nanoporous dielectric with a redox-active molecule. In the RW memory cell, at least two reversible redox reactions occur by applying voltage, with which the redox-active molecule switches between at least three oxidation stages. Only the redox reaction A↔B generates the state 1.

This storage array has at least two storage states, each with the same molecule, where the molecule without voltage applied forms a first state "0" (not redox-active) or "1" (redox-active) and by applying voltage reversibly switches the second state "1" (redox-active) or "0" (not redox-active).

3.a. RW memory (binary): For an RW configuration, a dielectric nanoporous layer with redox-active molecules is applied to all the intersection points (default "1"). This means that directly after production all cells have a value "1". In order to generate a value "0" from the value "1" a potential needs to be imposed between the two electrodes of the intersection point, which reversibly changes the redox molecules, for example by oxidation or reduction, into a second higher or lower oxidation state.

With a low reading potential, the redox cycling reaction no longer occurs at this intersection point; the redox cycling reaction does not occur because the altered molecules are no longer redox-active.

In order to generate a value "1" once more from the value "0", a reversed potential should be applied between the two electrodes of the intersection point, which once again sets the redox molecules reversibly back to the lower (or higher) oxidation state so that when a read potential of the storage state is applied a redox cycling reaction once again occurs at this intersection point in accordance with the redox reaction A↔B; see FIG. 1c with corresponding cyclical voltammograms, and Table 5a.

TABLE 5.a

RW (binary). Read 1 - before writing; Read 2 - after writing; Read 3 - after rewriting; Write - applying a write potential; Rewrite - applying a reverse write potential; all cells with default "1".

| Mode | Redox molecule concentration (discrete) | Cathode potential | Anode potential | Current value (discrete) | Memory cell value |
|---|---|---|---|---|---|
| Rest | [A + B] ≠ 0 | none | none | none | ? |
| Read 1 | [A + B] ≠ 0 | $V_{read(red)}$ | $V_{read(ox)}$ | 2 | "1" |
| | | Reversible writing by reduction | | | |
| Write | [A + B] ≠ 0 | $V_{write(red)}$ | GND | — | — |
| Read 2 | [A + B] = 0 | $V_{read(red)}$ | $V_{read(ox)}$ | 1 | "0" |
| | | or reversible writing by oxidation | | | |
| Write | [A + B] ≠ 0 | GND | $V_{write(ox)}$ | — | — |
| Read 2 | [A + B] = 0 | $V_{read(red)}$ | $V_{read(ox)}$ | 1 | "0" |
| | | Rewriting by re-oxidation (after reduction) | | | |
| Rewrite | [A + B] ≠ 0 | GND | $V_{write(ox)}$ | — | — |
| Read 3 | [A + B] ≠ 0 | $V_{read(red)}$ | $V_{read(ox)}$ | 2 | "1" |
| | | Rewriting by re-reduction (after oxidation) | | | |
| Rewrite | [A + B] ≠ 0 | $V_{write(red)}$ | GND | — | — |
| Read 3 | [A + B] ≠ 0 | $V_{read(red)}$ | $V_{read(ox)}$ | 2 | "1" |

The redox-active molecule must accordingly have a low reversible oxidation and reduction state, and in addition also a higher or lower second reversible oxidation or reduction state.

Such molecules are, for example, aromatic azo compounds such as azobenzene, azotoluene, etc., which are dissolved in a solution of dimethyl formamide with tetra-n-butylammonium perchlorate (TBAP) and can form RW memory cells according to embodiments of the invention.

In general, the following reactions must occur for RW memory cells:

1) A↔B and
2) B↔C and/or
3) A↔D

Alternatively, for an RW configuration a dielectric nanoporous layer with insoluble redox molecules is provided in the dielectric during production at all intersection points, which layer has a correspondingly small diffusion constant. These memory cells thus have a default "0" directly after their production. In order to generate a "1" from the value "0" a potential needs to be imposed between the two electrodes of the intersection point, which reversibly changes the redox molecules so that they become soluble and obtain a large diffusion constant.
1) C↔B and/or
2) D↔A and
3) A↔B Then when a "regular" low read potential is applied, a redox cycling reaction will occur in accordance with step 3) and generate state "1". In state "0", the diffusion of the molecules is then restricted to such an extent that only a half-reaction of the molecules can occur in the direct vicinity of the electrode surface, but no current is intensified by redox cycling. Hence, these currents cannot be recognized as "1"; a signal will only be read as "1" if it passes a threshold value.

In order to generate a value "0" once more from the value "1", a reversed potential should be applied between the two electrodes of the intersection point, which once again sets the redox molecules reversibly back to the lower (or higher) oxidation state so that the molecules again become insoluble and hence are not mobile in the dielectric, and when a "normal" low read potential of the storage state is applied once again no redox cycling reaction can occur at this intersection point. The redox molecules for RW memory cells must accordingly be reversibly oxidizable. In the first oxidation state, the redox molecules are not soluble and cannot diffuse between the electrodes. They must then also have a higher second reversible oxidation or reduction state in order to be read. For example, ferrocene (not soluble in water) and its derivatives like ferrocene methanol (soluble in water) can be used for this, being able to be converted reversibly from one state to the [other?].

3.b. Multi-level RW. This storage array is provided as shown in 3.a., but with several concentrations of redox molecules, for example with up to 16 different concentrations for creating hexadecimal memory cells. The different concentrations of redox-active molecules are generated by writing, as in the WORM memory cell. During production, the dielectric with the highest concentration of redox-active molecules is prepared.

The following read and write modes are possible; see the selection of examples in Table 5b and FIG. 1c.

TABLE 5b

Multi-level RW (HEX), by way of example (not all 16 states are shown): Read 1 - before writing; Read 2 - after writing; Read 3 - after rewriting; Write - voltage pulse with given parameter; Rewrite - reversed voltage pulse with given parameter; Default - all cells are "1".

| Mode | Redox molecule concentration (discrete) | Cathode potential | Anode potential | Current value (discrete) | Memory cell value |
|---|---|---|---|---|---|
| Rest | [A + B] = 15 | none | none | none | ? |
| Read 1 | [A + B] = 15 | $V_{read(red)}$ | $V_{read(ox)}$ | 16 | "F" |
| Reversible write 1 by reduction |
| Write | [A + B] = 3 | $V_{write(red)}$ | GND | — | — |
| Read 2 | [A + B] = 3 | $V_{read(red)}$ | $V_{read(ox)}$ | 4 | "3" |
| or write 1 by oxidation |
| Write | [A + B] = 3 | GND | $V_{write(ox)}$ | — | — |
| Read 2 | [A + B] = 3 | $V_{read(red)}$ | $V_{read(ox)}$ | 4 | "3" |
| Rewriting by re-oxidation (after reduction) |
| Rewrite | [A + B] = 11 | GND | $V_{write(ox)}$ | — | — |
| Read 3 | [A + B] = 11 | $V_{read(red)}$ | $V_{read(ox)}$ | 12 | "B" |
| Rewriting by re-reduction (after oxidation) |
| Rewrite | [A + B] = 11 | $V_{write(red)}$ | GND | — | — |
| Read 3 | [A + B] = 11 | $V_{read(red)}$ | $V_{read(ox)}$ | 12 | "B" |

Thus, for example, the RW memory cell is produced with a large concentration of redox-active molecules in the dielectric. A first write process is carried out by applying the write potential and it reversibly rewrites the redox-active molecule until it has a smaller concentration of [A+B], here, the discrete concentration 3. The first write process occurs either by oxidation or reduction.

The intermediate levels can be established by the form of the write pulse. For example, by varying the shape and strength of the voltage pulse only a portion of the redox molecules can be changed reversibly from the value "1", thereby reaching a certain concentration, i.e. the concentration of the readable redox molecules is decreased.

After this, with a suitable pulse the altered, not-readable redox molecules may be reversibly changed back to the original state, or to a different intermediate state, here, the discrete concentration with value 11, and once more increase the concentration of the readable redox molecules.

Of course, the molecules A and B indicated only schematically for the ROM memory cells, WORM memory cells and RW memory cells, as well as possibly also C and D, must in fact be different, in order to fulfill the above described prerequisites. There is in fact $A_{ROM}$, $B_{ROM}$, $A_{WORM}$, $B_{WORM}$, $C_{WORM}$, $D_{WORM}$, $A_{RW}$, $B_{RW}$, $C_{RW}$, $D_{RW}$.

The memory cells ROM, WORM and RW thus differ from each other by chemically different redox-active molecules or oxidation states $A_{ROM}$, $B_{ROM}$, $A_{WORM}$, $B_{WORM}$, $C_{WORM}$, $D_{WORM}$, $A_{RW}$, $B_{RW}$, $C_{RW}$, $D_{RW}$, where the cyclical reaction to generate current above the threshold value and thus storage state 1 occurs between A↔B, as indicated inter alia in the embodiments.

The memory cells WORM and RW also differ from each other by chemically different molecules C and D which can be generated by write potentials.

The memory (arrays) according to embodiments of the invention are used as a non-volatile memory for generating bits and bytes on a binary or hexadecimal base, or any other base.

The ink for the production of such a memory also already solves a problem. For this, the ink comprises the precursors of a sol-gel reaction or for hydrogels and the redox-active molecules which can diffuse between the electrodes by drying or curing of the ink on the conductor track, either immediately as default "1" or after applying a voltage pulse, which makes the molecules in the dielectric soluble (default "0").

The ink used can be any liquid composition which can be used in particular with a printing process, which after deposition [forms] a dielectric layer, preferably with redox-active molecules, and which makes possible the diffusion of the redox-active molecules. The diffusion occurs through the nanopores of the nanoporous dielectric. The pore size for this should be greater than the molecule size of the redox-active molecules. For usual sizes of the redox-active molecules of around 1 to 5 nm, the pore size should be, for example, at least 2 to 10 nm or more (factor of 2). If the dielectric layer has a solid but quasi-liquid phase, such as with a hydrogel, the diffusion occurs directly through this phase.

Regardless of the physical principle of action, the diffusion constant of the redox-active molecules for diffusion through the pores should be as close as possible to the diffusion constant in the liquid phase without pores and amount to at least 1% or more of this, for example at least 5%, 10%, 15%, 20%, 30%, 40%, 50%, 60%, 70%, 80%, 90% or even 100%.

According to a definition of the redox-active molecules, these are not enzymes.

The ink should have a solid fraction, so that the layer thickness of the dielectric layer after printing and drying is around 50 to 1000 nm, preferably 100 to 300 nm.

Preferably, the nanoporous dielectrics are produced between the electrodes with the indicated components after the printing on the first conductor track. For this, the ink advantageously contains the starting components for a sol-gel reaction, for example tetramethyl orthosilicate, tetraethoxysilane, etc. In the first step, hydrolysis occurs in water and alcohol, and then in another step condensation to form the sol-gel matrix with residual liquid.

The ink for this preferably has a solvent with low vapor pressure and correspondingly high boiling point.

FIG. 1a) shows the cyclical voltammogram of an ROM cell. FIG. 1 b) shows the cyclical voltammogram of a WORM cell. FIG. 1 c) shows the cyclical voltammogram of an RW cell. The read and write modes will be found in the descriptions for Tables 3 to 5.

Figure 2:
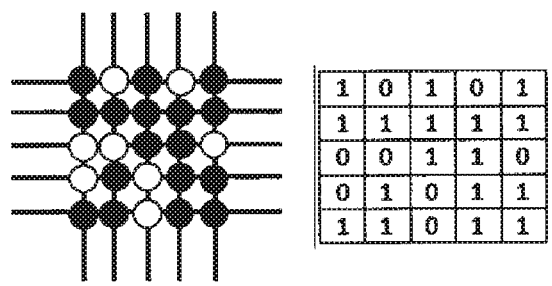
FIGS. 2a through 2c provide, for ROM binary, WORM/RW binary, and multi-level ROM/WORM/RW, a schematic representation of a storage array according to embodiments of the invention.
Figure 2:
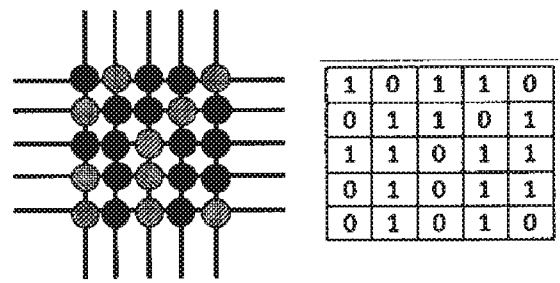
Figure 2:
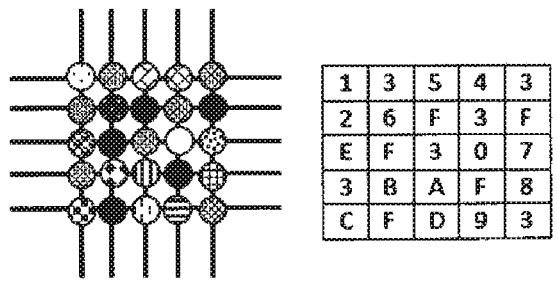

FIG. 2a shows schematically the arrangement of the nanoporous dielectrics at 16 intersection points between the electrodes in an ROM storage array, binary. The storage states—here only "0" and "1"—are indicated on the right-hand side. Accordingly, only the states "0" and "1" are possible for the ROM; see Table 3a. Clear circles relate to the memory cells without redox-active molecules, solid circles on the other hand are memory cells with redox-active molecules, i.e. those in which current can be generated.

FIG. 2b shows schematically the arrangement of the nanoporous dielectrics at 16 intersection points between the electrodes in a WORM or RW storage array. The storage states—here only "0" and "1" (binary)—are indicated on the right-hand side; see Tables 4a and 5a. The black circles symbolize the memory cells with redox-active molecules in which current can be generated, the gray circles the memory cells with inadequate current.

FIG. 2c shows schematically the arrangement of nanoporous dielectrics at 16 intersection points between the electrodes in a multi-level ROM/WORM or RW storage array, binary. The different storage states—from "0" to "F"—are indicated on the right-hand side. These storage states are indicated on the left of the drawing by the different hatching at the intersection points and thus by the different concentrations.

Embodiment 1

25-bit (binary) printed redox cycling-based electrochemical ROM memory module (FIGS. 1a, 2a and 3 to 4).

Figure 3:
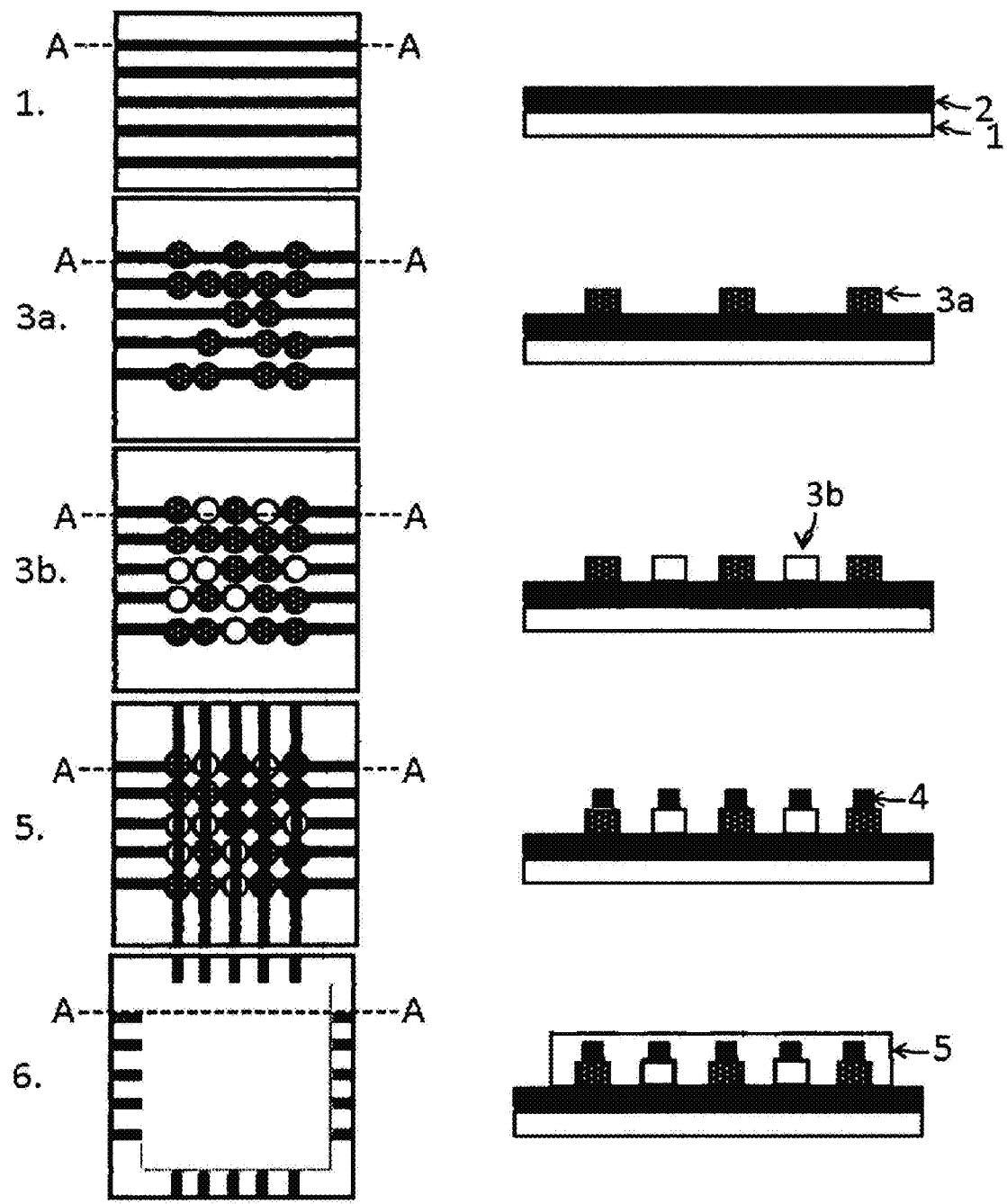
FIG. 3 shows a method for producing a storage array (ROM/WORM/RW)

FIG. 2a shows schematically the arrangement of the ROM storage array in the finished state. FIG. 3 shows the corresponding production process in a top view on the left and in cross section along line A-A on right of the drawing. For space considerations, only one structure in FIG. 3 has been given a reference number.

1. Gold ink is used as the material for the first conductor track 2 or for the lower electrode. The conductive structures 2, represented by a total of five lines (100 μm in width, 100 μm spacing between the conductor tracks), made of the gold ink are printed on a PEN (polyethylene naphthalate) substrate 1 with an inkjet printer and then sintered at 125° C. for 1 hour.

2. Two sol-gel inks are prepared:

a. Without redox molecules: TMOS (tetramethyl orthosilicate) is mixed 1:1:1 (parts by weight) with deionized water and glycerol in a 100 mL flask and stirred for one hour with a magnetic agitator on a magnetic plate at room temperature. After this, 100 mM solution of hydrochloric acid in 500:1 (sol-gel: acid, parts by weight) is added for the start of the condensation reaction.

b. With redox molecules: A 1 mM solution of a mixture of redox molecules hexacyanoferrate (II)/hexacyanoferrate (III) (normal potential+200 mV against a calomel electrode SCE) is prepared in deionized water. TMOS is mixed 1:1:1 (parts by weight) with the ferrocene dimethanol solution and glycerol in a 100 mL flask and stirred for one hour with a magnetic agitator on a magnetic plate at room temperature. After this, 100 mM solution of hydrochloric acid in 500:1 (sol-gel: acid, parts by weight) is added for the start of the condensation reaction. If necessary, a 10-100 mM salt solution (e.g. NaCl) is added to this in order to improve the electrical conductivity of the layer and the electron transfer.

3. The sol-gel inks are printed at the future intersection points. At places where a state "1" will be read (FIG. 3b), the ink is printed with the redox molecules for the nanoporous dielectric 3a, represented by the dark circles on the left-hand side of FIG. 3b. At places where a state "0" will be read, the ink is printed without redox molecules for the nanoporous dielectric 3b, represented by the clear circles.

4. After the printing of the nanoporous dielectrics 3a, 3b, the printed ink is cured at room temperature for one hour, so that the printed dielectrics still contain residual liquid.

Accordingly, the pointlike nanoporous dielectric is formed with (reference numeral 3a) and without (reference numeral 3b) a redox-active molecule.

5. Carbon ink made of carbon nanoparticles 300-400 nm in size is used as the material for the second conductor track 4 or upper electrode. This ink is printed orthogonally to the first conductor tracks 2 on top of the nanoporous dielectrics in order to form the "crossbar" structure (matrix) and the contact sites. In total, as for the conductor track 2, once again five conductor tracks or electrodes 4 are shown. The ink is sintered for 1 hour at 125° C. after the printing.

6. As a passivation layer 5, a layer of polyimide is applied over a broad area, for example printed, so that only the contact sites at the end of the electrodes remain open or contactable, as shown on the left in FIG. 3.

7. In order to read out the memory, all the electrodes are contacted at the same time or one after the other (by a switch). At each intersection point, a potential of 0 mV to ground is applied on the lower electrode, while on the upper electrode a potential of +300 mV to ground is applied. The reference electrode is omitted in this design and the current is measured without a reference electrode to ground. If the current read out exceeds a given current value (depending on the cell design and the concentration of the redox molecules, around 40 pA for this example) after a given time (depending on the cell design, around 3 ms for this example), this cell is identified as state "1". Otherwise, it is identified as state "0".

Embodiment 2

A 25-bit (HEX) printed redox cycling-based electrochemical ROM memory module (FIG. 1a, FIG. 2c, FIG. 3) is produced.

Steps 1 to 6 correspond to those of embodiment 1. However, up to 16 different inks with up to 16 different concentrations of redox molecules are prepared. In this way, 16 inks with 16 concentrations of, for example, 0 µM, 1 µM, 5 µM, 10 µM, 25 µM, 50 µM, 100 µM, 200 µM, 300 µM, 400 µM, 500 µM, 600 µM, 700 µM, 800 µM, 900 µM, 1000 µM of the redox molecules hexacyanoferrate (II)/hexacyanoferrate (III) are prepared. The concentrations are shown in FIG. 2c by circles with different fillings.

These inks are printed one after the other by several print heads or nozzles in the intersection points of the storage array as a dielectric nanoporous layer 3 in order to create 25-bit (HEX) memory modules.

7. In order to read out the memory, all the electrodes are contacted at the same time or one after the other (by a switch). At each intersection point, a potential of −300 mV to ground is applied on the lower electrode 2, while on the upper electrode 4 a potential of +300 mV to ground is applied. The reference electrode is omitted in this design and the current is measured without a reference electrode to ground. The current read out after a given time (depending on the cell design, around 3 ms for this example) is associated with a particular concentration (from a total of 16 precalibrated current values, also see FIG. 4) in order to read out the storage state of the cell. States between "0" and "F" are then possible (0, 1, 2, 3, 4, 5, 6, 7, 8, 9, A, B, C, D, E, F).

As an example, FIG. 4 shows that the measured currents can be associated with the concentrations for reading the 16 states.

Embodiment 3

A 25-bit (binary) printed redox cycling-based electrochemical WORM memory module (FIG. 1b, FIG. 2b, FIG. 3) is produced.

Steps 1-7 correspond to those of embodiment 1. The differences lie in steps 2 and 3, and a step 6* also occurs.
1. Like embodiment 1, but step 2a is omitted. Each nanoporous dielectric thus contains ink with redox-active molecules. In step 2b, heptyl viologen bromide with a normal potential of the first reversible reduction reaction of −300 mV and a normal potential of the second irreversible reduction reaction of −700 mV is used instead of a hexacyanoferrate (II)/hexacyanoferrate (III) mixture.
2. This sol-gel ink is printed at all future intersection points in order to form the default "1" (step 3).

Before step 7, an irreversible write step may optionally occur:
6*. In order to generate state "0" from state "1" at certain particular intersection points (memory cells of the array), a reduction potential of −1 V is applied between the upper and lower electrodes at these intersection points for 1 second. The applied potential is enough to drive the irreversible reaction A→D. After this, the molecules are no longer redox-active in the region of read potentials in the sense of the redox reaction A↔B. Instead, the redox-active molecules are present in the inactive reduced form D.
7. As in embodiment 1.

Embodiment 4

A 25-bit (binary) printed redox cycling-based electrochemical RW memory module (FIG. 1c, FIG. 2b, FIG. 3) is produced.

Steps 1 and 3-5 correspond to those of embodiment 3. The difference lies in steps 2 and 6*, and in addition a step 8 also occurs:
2. Azotoluene of the first reversible oxidation reaction of +300 mV and a normal potential of the second reversible reduction reaction of +700 mV is used instead of heptyl viologen bromide. After applying ink with the redox-active molecule, all the memory cells have the default "1".
6*. In order to generate a state "0" from the state "1" at particular intersection points or memory cells of the array, an oxidation potential of +1.5 V is applied between the upper and the lower electrode at these intersection points for 1 second. After this, the molecules are no longer redox-active in the region of the read potential of the redox reaction A↔B, since molecule C was created. Alternatively, the molecule D can also be generated by a corresponding reduction potential of −1.5 V.
8. In order to obtain once more the state "1" from the written state "0" at particular intersection points, a reversed reduction potential (or oxidation potential) of −1.5 V is applied at these intersection points for 1 second. After this, the molecules are again redox-active in the region of read potentials of the redox reaction A↔B.

Embodiment 5

A 25-bit (hexadecimal) printed redox cycling-based electrochemical RW memory module is produced.

The procedure corresponds to embodiment 2, steps 1-6. The only difference is in the redox-active molecules in step 2. The molecules used here correspond to those of step 2 in embodiment 4 (RW binary memory). In order to write the memory (step 7), a write potential is applied for a defined short period of time, for example for 100 ms. To decrease the stored state, an oxidation potential is applied, so that a portion of the particles are converted into a reversible, higher oxidation state (B→C). To increase the stored state, a reducing potential is applied, so that a portion of the particles are converted from the higher to the lower state (C→B) and are again available for the redox cycling. This process may also occur in the direction of a second reduction. The potentials for this are applied precisely in the reverse manner. The reading then occurs analogously to step 7, embodiment 2.

Further Embodiments

Further embodiments relate to the production and use of such memory cells for the food industry. The ROM memory cells disclosed in the embodiments, and especially in embodiments 1 and 2, are particularly suitable for the production of printed memory cells on packages in the food industry. The reason is because the redox molecules, such as hexacyanoferrate (II)/hexacyanoferrate (III), are largely safe for foods, especially when they are arranged on the surface of the cartons or other packages containing the food.

Such ROM memory cells may then be used to store and also easily retrieve information about the food, such as the production date, the expiration date, the packaging date of the food, and other relevant parameters, such as the origin of the food or transport channels etc. during production.

It is conceivable to apply the necessary voltage to the memory cell for the reading even without electronic feed lines and to retrieve the corresponding parameters for example by radio waves, as in an RFID tag.

A method according to an embodiment of the invention can be implemented for this purpose by using a component of such a package as a non-conducting substrate.

The use of the memory cells according to embodiments of the invention then relates to the additional feature whereby this memory cell is arranged on packaging in the food industry. The memory cell could also be glued onto the package.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for producing a memory cell, the method comprising:
   a) providing a non-conductive substrate;
   b) mounting a first conductor track on the non-conductive substrate;
   c) mounting a porous dielectric with redox-active molecules at an intersection point on the first conductor track such that the porous dielectric contacts a top side of the first conductor track at the intersection point, wherein the porous dielectric is a sol-gel ink or a hydrogel ink that is dried after being mounted on the first conductor track so as to form a nanoporous layer comprising pores having a residual liquid volume that includes the redox-active molecules;
   d) mounting a second conductor track orthogonally to the first conductor track such that the second conductor track contacts a top side of the porous dielectric at the intersection point; and
   e) mounting, in a manner such that the first and second conductor tracks remain contactable, a passivation layer on the substrate, the first conductor track, the porous dielectric, and the second conductor track;
   wherein the first conductor track forms a first electrode at the intersection point and the second conductor track forms a second electrode at the intersection point,
   wherein the first conductor track, the porous dielectric, and the second conductor track are configured to form a memory state at the intersection point, and
   wherein the first and second conductor tracks are configured to apply a voltage between the first and second electrodes so as to drive a redox reaction of the redox-active molecules in order to generate the memory state.

2. The method as claimed in claim 1, wherein the first conductor track and/or the porous dielectric and/or the second conductor track and/or the passivation layer are mounted by a printing method.

3. The method as claimed in claim 1, wherein the sol-gel ink or the hydrogel ink includes the redox-active molecules, and wherein the redox-active molecules are configured to diffuse into the pores of the porous dielectric and become transformed at the first and second electrodes.

4. The method as claimed in claim 1, further comprising mounting a plurality of additional first conductor tracks arranged orthogonally to the second conductor track, mounting additional porous dielectrics at additional intersection points on the first conductor track or on the additional first conductor tracks, and mounting a plurality of additional second conductor tracks arranged orthogonally to the first conductor track such that the plurality of additional second conductor tracks contact a top side of the additional porous dielectrics at the plurality of additional intersection points in order to form a storage array.

5. The method as claimed in claim 4, wherein the additional porous dielectrics include redox-active molecules of inks with different concentrations and/or substances.

6. The method as claimed in claim 1, wherein the porous dielectric includes residual liquid, and
   wherein the redox-active molecules are configured to be transported to the first and second electrodes by diffusion in the residual liquid.

7. A memory cell, comprising:
   a non-conducting substrate;
   a first electrically contactable conductor track disposed on the non-conducting substrate;
   a porous dielectric including residual liquid and redox-active molecules freely diffusible into pores, the porous dielectric being disposed at an intersection point on the first electrically contactable conductor track such that the porous dielectric contacts a top side of the first electrically contactable conductor track; and
   a second electrically contactable conductor track arranged orthogonally to the first electrically contactable conductor track and further arranged so as to contact a top side of the porous dielectric at the intersection point,
   wherein the first electrically contactable conductor track forms a first electrode at the intersection point and the second electrically contactable conductor track forms a second electrode at the intersection point,
   wherein the first and second electrically contactable conductor tracks are configured to apply a voltage between the first and second electrodes so as to oxidize and/or reduce the redox-active molecules in the porous dielectric in order to create storage states,
wherein the redox-active molecules are configured to be transported to the first and second electrodes by diffusion in the residual liquid, and
wherein the memory cell is completely passivated by a passivation layer.

8. A storage array having a plurality of memory cells as claimed in claim 7 in a "crossbar" configuration.

9. The storage array as claimed in claim 8, wherein different memory cells of the storage array comprise several different redox-active molecules and/or different concentrations of a redox-active molecule.

10. The storage array as claimed in claim 8, wherein the storage array is a read-only memory (ROM) storage array comprising a plurality of nanoporous dielectrics without redox-active molecules and a plurality of nanoporous dielectrics with a redox-active molecule, wherein the redox-active molecule is configured to be reversibly oxidized and reduced solely between its two oxidation states according to a reaction A↔B.

11. The storage array as claimed in claim 8, wherein the storage array is a write once, read many memory (WORM) storage array comprising a plurality of nanoporous dielectrics with a redox-active molecule, wherein the redox-active molecule is configured to be reversibly oxidized and reduced between its two oxidation states A and B according to a first reaction A↔B, and wherein the redox-active molecule additionally has at least one further irreversible oxidation state according to a second irreversible reaction B→C and/or a third irreversible reaction A→D.

12. The storage array as claimed in claim 8, wherein the storage array is a rewritable memory (RW) storage array comprising a plurality of nanoporous dielectrics with a redox-active molecule, wherein the redox-active molecule is configured to be reversibly oxidized and reduced between its two oxidation states A and B according to a first reaction A↔B, and wherein the redox-active molecule additionally has at least one further reversible oxidation state according to a second reversible reaction B↔C and/or a third reversible reaction A↔D.

13. The ROM storage array as claimed in claim 10, wherein the redox-active molecule is configured to be reversibly oxidized and reduced according to the reaction A↔B by applying voltage to the first and second electrodes with a read out potential above and below the normal potential of the redox-active molecule and the current measured upon passing a threshold value is read out as the state "1" and wherein the state 0 is read out for memory cells without redox-active molecules.

14. The WORM storage array as claimed in claim 11, wherein the redox-active molecule is configured to be reversibly oxidized and reduced according to the reaction A↔B by applying voltage to the first and second electrodes with a read out potential above and below the normal potential of the redox-active molecule and the current measured upon passing a threshold value is read out as the state 1.

15. The WORM storage array as claimed in claim 14, wherein the redox-active molecule is configured to be rewritten into the irreversible oxidation state according to the reaction B→C or A→D by applying voltage to the first and second electrodes with a writing potential, so that the redox-active molecule is no longer oxidized or reduced according to the reaction A↔B by applying voltage to the first and second electrodes with a read out potential above and below the normal potential of the redox-active molecule and the current measured is read out as the state 0.

16. The RW storage array as claimed in claim 12, wherein the redox-active molecule is configured to be reversibly oxidized and reduced according to the reaction A↔B by applying voltage to the first and second electrodes with a read out potential above and below the normal potential of the redox-active molecule and the current measured upon passing a threshold value is read out as the state 1.

17. The RW storage array as claimed in claim 12, wherein the redox-active molecule is configured to be rewritten into the reversible oxidation state according to the reaction B↔C or A↔D by applying voltage to the first and second electrodes with a writing potential, so that the redox-active molecule is no longer oxidized or reduced according to the reaction A↔B by applying voltage to the first and second electrodes with a read out potential above and below the normal potential of the redox-active molecule and the current measured is read out as the state 0.

18. The RW storage array as claimed in claim 16, wherein the redox-active molecule is configured to be rewritten into the reversible oxidation state according to the reaction A↔B by applying voltage to the first and second electrodes, so that the redox-active molecule is again reversibly oxidized and reduced according to the reaction A↔B by applying voltage to the first and second electrodes with a read out potential above and below the normal potential of the redox-active molecule and the current measured upon passing the threshold value is read out as the state 1.

19. The storage array as claimed in claim 8, wherein the storage array is a read only memory (ROM) storage array including a plurality of memory cells with different concentrations of redox-active molecules in the porous dielectrics and wherein the storage array is addressed via the first and second electrodes by read out potentials and the current measured upon passing the threshold value is coordinated with different storage states according to the different concentrations, or
wherein the storage array is a rewritable memory (RW) storage array or a write once read many memory (WORM) storage array including a plurality of memory cells with different concentrations of redox-active molecules in the porous dielectrics generated reversibly or irreversibly by write potentials, and wherein the first and second electrodes are addressed by read out potentials and the current measured is coordinated with different storage states upon passing the threshold value.

20. The memory cell as claimed in claim 7, wherein the porous dielectric including residual liquid and redox-active molecules freely diffusible into pores is a sol-gel that has undergone a condensation reaction to form the pores.

* * * * *